United States Patent
Happ

(10) Patent No.: US 8,026,123 B2
(45) Date of Patent: Sep. 27, 2011

(54) INTEGRATED CIRCUIT INCLUDING A MEMORY APPARATUS AND PRODUCTION METHOD

(75) Inventor: Thomas Happ, Tarrytown, NY (US)

(73) Assignee: Qimonda AG, Munich (DE)

( * ) Notice: Subject to any disclaimer, the term of this patent is extended or adjusted under 35 U.S.C. 154(b) by 1036 days.

(21) Appl. No.: 11/329,659

(22) Filed: Jan. 11, 2006

(65) Prior Publication Data

US 2006/0166471 A1 Jul. 27, 2006

(30) Foreign Application Priority Data

Jan. 12, 2005 (DE) .......... 10 2005 001 460

(51) Int. Cl.
*H01L 21/00* (2006.01)
(52) U.S. Cl. .............................................. 438/95
(58) Field of Classification Search ................ 438/95; 257/3
See application file for complete search history.

(56) References Cited

U.S. PATENT DOCUMENTS

| | | | |
|---|---|---|---|
| 6,897,518 B1 * | 5/2005 | Park et al. ................ | 257/315 |
| 6,972,429 B1 * | 12/2005 | Hsueh et al. ............... | 257/3 |
| 2003/0045049 A1 * | 3/2003 | Campbell et al. ............ | 438/237 |
| 2004/0188735 A1 | 9/2004 | Hideki | |
| 2006/0091476 A1 * | 5/2006 | Pinnow et al. ............... | 257/379 |
| 2006/0289848 A1 * | 12/2006 | Dennison .................... | 257/3 |

FOREIGN PATENT DOCUMENTS

| | | |
|---|---|---|
| DE | 2346569 A1 | 6/1974 |
| DE | 102 36439 | 2/2004 |
| EP | 1331675 A1 | 7/2003 |

OTHER PUBLICATIONS

German Office Action dated Oct. 28, 2005.
J. Ohsawa et al., "Charge Storage Characteristics of pnp GaAs Layers Prepared by Iron Diffusion", Electronics and Communications in Japan, Part 2 (Electronics), vol. 80, No. 12, 1997, pp. 1-6.
S. Privitera et al., "Amorphous-to-crystal transition of nitrogen- and oxygen-doped Ge2Sb2Te5 films studied by in situ resistance measurements", Applied Physics Letters, vol. 85, No. 15, Oct. 11, 2004, pp. 3044-3046.
European Search Report, Jun. 10, 2008.

* cited by examiner

*Primary Examiner* — Bradley K Smith
(74) *Attorney, Agent, or Firm* — Dicke, Billig & Czaja, PLLC

(57) ABSTRACT

The memory apparatus according to the invention and having a cell 14 has a high electrical resistance in a first state and a low electrical resistance in a second state. The cell 14 has an edge area 16 and a core area 15, in which the electrical resistivity in the edge area 16 is higher than in the core area 15 in the second state.

11 Claims, 3 Drawing Sheets

INTEGRATED CIRCUIT INCLUDING A MEMORY APPARATUS AND PRODUCTION METHOD

TECHNICAL FIELD

The present invention relates to a memory apparatus and to a production method for a memory apparatus.

BACKGROUND ART

Memory cells are characterized, inter alia, by their cell size, volatility of the stored information and reading reliability. In this case, there is a desire to develop memory cells which occupy a smaller volume, in order to achieve an increased integration density with the generally known advantages; to replace conventional volatile memory cells such as DRAMs by non-volatile memory cells, and to improve the reading reliability by increasing the signal difference between the binary states (high, low).

Although the present invention is described with reference to phase change memory cells (PC-RAM, phase change RAM), which are also referred to as ovonic unified memory (OUM) cells, the present invention is not restricted to them but relates in general to memory apparatuses and production methods.

One concept of memory cells which is superior in terms of the characteristics mentioned above to conventional memory cells in DRAM, SRAM or flash memory cells, is so-called OUM memory cells, which are also referred to as phase change random access memory (PCRAM). The configuration of a PC-RAM will be described schematically with reference to FIG. 1. A memory cell 4 which is formed from $Ge_2Sb_2Te_5$ (GST) is arranged between two contact areas 5 and 6. The information in this memory cell 4 is coded in the form of the electrical resistance, with a high resistance corresponding, for example, to a logic zero and a correspondingly low resistance corresponding to a logic 1. The resistivity of GST in the amorphous phase is higher than in the crystalline phase. By heating GST to a crystallization temperature of about 420° C., the GST changes from the amorphous phase state to the crystalline phase state. The reverse process is achieved by heating GST to above its melting temperature of about 620° C., with the amorphous state phase being formed when it is cooled down rapidly. GST is expediently stable for more than 10 years both in the glass phase and in the crystalline phase up to temperatures of 100° C. Memory cells composed of GST are thus suitable for non-volatile memory components which can be read in a simple manner by determination of their resistance. The heat power required to change between the two phases is expediently provided by means of a heating current which flows through the memory cell and is controlled by means of a transistor. In order to achieve the required melting temperature, the transistor must be designed such that it can switch the heating current that is required for this purpose. In this case, it has been found that the dimensions of the corresponding transistor limit the integration density of a memory component.

The heating of the memory cell up to the melting temperature does not take place homogeneously across the memory cell 4. GST is less thermally conductive than the materials surrounding the memory cell in the contact-making areas and in the embedding 2. This means that the edge areas of the memory cell are cooled down by the thermal contact with the embedding 2, while the thermal balance within the memory cell is only to a limited extent, owing to the low thermal conductivity. This means that, if a relatively small current pulse is used for heating, the melting temperature is reached only in an inner area of the memory cell 4. The outer radial edge areas which are in contact with the embedding 2 do not reach the temperature which is required to change to the amorphous phase. This reduces the maximum achievable resistance of the memory cell, since there are low-resistance crystalline edge areas in parallel with the high-resistance inner area that is in the form of glass. This disadvantageously results in a decreased signal difference between the two resistance values of the memory cell, and thus in reduced reading reliability. Because of the problems that have already been explained relating to the integration density of the transistor that controls the heating current, the heating current cannot be increased indefinitely in order to heat the outer areas above the melting temperature.

SUMMARY OF THE INVENTION

One object of the present invention is to provide a semiconductor memory apparatus which allows a large signal difference with a low heating current. A further object is to provide a production method by means of which a corresponding memory apparatus can be produced.

One idea of the present invention is to design an edge area of the memory cell such that it has a higher resistance than a core area of the cell. Complete conversion of the edge area from the low-resistance, crystalline state to the high-resistance state in the form of glass is compensated for by the outer area always having a considerably higher resistivity than the core area.

The memory apparatus according to the invention and having at least one cell has a high electrical resistance in a first state and has a low electrical resistance in a second state. The cell has an edge area and a core area, with the resistivity in the edge area being higher than in the core area in the second state.

The production method according to the invention envisages the application of an active material to a mount substrate, and this material being structured so as to form a preform of a cell. Impurities are introduced into the preform in such a way that an impurity concentration in an edge area is higher than in a core area of the preform. This results in the preform being used to form a cell which has lower specific electrical conductivity in the edge area.

Developments and refinements of the present invention are described in the dependent claims.

According to one refinement of the present invention, the concentration of the impurities increases continuously from the edge area towards the core area.

According to one refinement of the present invention, the impurities include oxygen and/or nitrogen and/or silicon. Nitrogen is particularly suitable for increasing the resistivity of chalcogens, such as $Ge_2Sb_2Te_5$, which is typically used as the active material, in moderate concentrations.

According to one development of the present method, the impurities are introduced by diffusion from an atmosphere containing the impurities. This allows the impurities to be introduced in a simple manner, and allows the concentration profile in the cell to be controlled by monitoring the atmosphere, concentration of the impurities in the atmosphere, pressure, and temperature.

According to a further development, the impurities are implanted at right angles to the edge area or from a direction at an angle to the edge area. This makes it possible, inter alia, to use plasma-assisted implantation methods.

According to one refinement of the present invention, an active material of the cell is amorphous in a first state in the core area and is crystalline in a second state in the cell.

According to one development of the present invention, the resistivity in the second state increases continuously from the edge area to the core area.

According to one refinement of the present invention, the edge area is partially crystalline in the first state.

Preferred embodiments of the present invention will be explained with reference to the figures, in which:

DETAILED DESCRIPTION OF THE INVENTION

Identical reference symbols denote identical or functionally identical devices in the figures.

Figure 1:
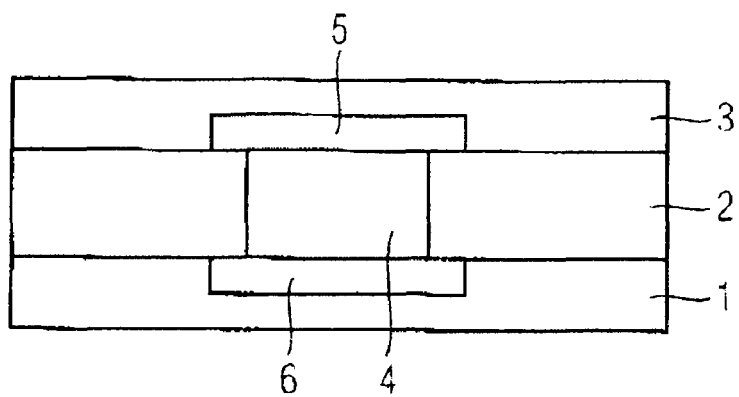
FIG. 1 shows a memory cell in order to explain the present problem.
Figure 2:
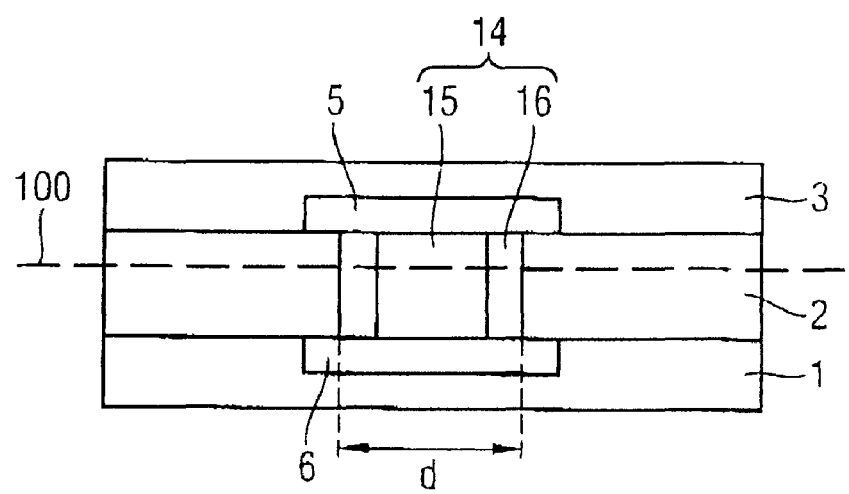
FIG. 2 shows a schematic cross-sectional view of one embodiment of the present invention.

FIG. 2 shows, schematically, a cross-sectional view of one embodiment of the memory apparatus according to the invention. A cell 14 is arranged between two opposite contact areas 5, 6. The cell 14 has a core area 15 and an outer edge area 16, with each of the areas 15, 16 in the illustrated embodiment connecting the lower contact area 6 to the upper contact area 5. In other words, the edge area 16 corresponds essentially to the circumference of the cell 14, which does not run parallel to the contact surfaces 5, 6. The lower contact area 6 is embedded in a mount substrate 1, in which further semiconductor structures can be arranged. The edge area 16 of the cell 14 is surrounded by embedding 2 composed of a filling compound, which is applied to the mount substrate 1. The embedding 2 and the upper contact area 5 are covered with a cover layer 3 in which further structures can be introduced or on which structures can be applied. The cell 14 has an active material which is chosen from the group of chalcogenides. One particularly preferred material is $Ge_2Sb_2Te_5$, although other materials, such as AgInSeTe can also be used. The chalcogenides are distinguished by a metastable glass phase at temperatures up to 100° C. The stable chalcogenide state has a crystalline phase. The chalcogenide compound is changed from the glass phase, which is also referred to as the amorphous phase, to the crystalline phase by heating it to a crystallization temperature.

Once this crystallization temperature, about 420° C. for GST, has been exceeded and this temperature has been maintained for a certain time (for example 50 nanoseconds), the chalcogenide crystallizes. The chalcogenide solidifies in the glass phase by melting the chalcogenide and by subsequently cooling it down quickly. The melting temperature of GST is about 620° C. The rapid cooling down is achieved by means of the contact surfaces 5, 6 and the embedding 2. The glass phase is reached within one nanosecond with the typical dimensions d of the cell 14 of 50 nanometres. The duration for complete crystallization of the chalcogenide in the cell 14 is in the order of magnitude from 10 nanoseconds to 50 nanoseconds. For use as a memory cell, it is of interest that the two phases, which are also referred to in the following text as states, are stable at typical operating temperatures of a semiconductor component, and thus do not change. Furthermore, a change between the two states can be achieved only by heating.

The state of the cell 14 or the phase of the active material can be determined by the different resistivity of the crystalline phase and of the glass phase. In the crystalline phase, the chalcogenide typically has a resistivity of $10^{-3}$ to $10^{-2}$, $\Omega$cm, and in the amorphous phase it has a resistivity that is higher than this by a factor of 100-1000. The state of the cell is thus determined by measuring the resistance of the cell 14 between the two contact surfaces 5, 6.

The heating power to change the phase, that is to say from the amorphous to the crystalline phase (set) and from the crystalline to the amorphous phase (reset) is supplied by means of a heating current through the contact surfaces 5, 6. During this process, a dynamic equilibrium is achieved in the temperature distribution in the cell 14. The temperature in the core area 15 is higher than in the edge area 16, since the edge area is in contact with the large thermal reservoir of the embedding 2, and the amount of heat within the cell 14 is redistributed to only a minor extent, owing to the low thermal conductivity of the chalcogenides, in order to compensate for the heat losses in the edge area 16 of the cell 14. This means that the outer areas can be heated up to the melting temperature only with very high heating currents, and thus remain essentially permanently in the low-resistance crystalline state. The total resistance of the cell 14 in the high-resistance state is thus composed of the high resistance 15 of the core area 15 and the low remaining resistance of the edge area 16. This limits the maximum achievable resistance of the cell, and hence also the contrast between the high-resistance state and the low-resistance state of the cell 14.

Figure 3:
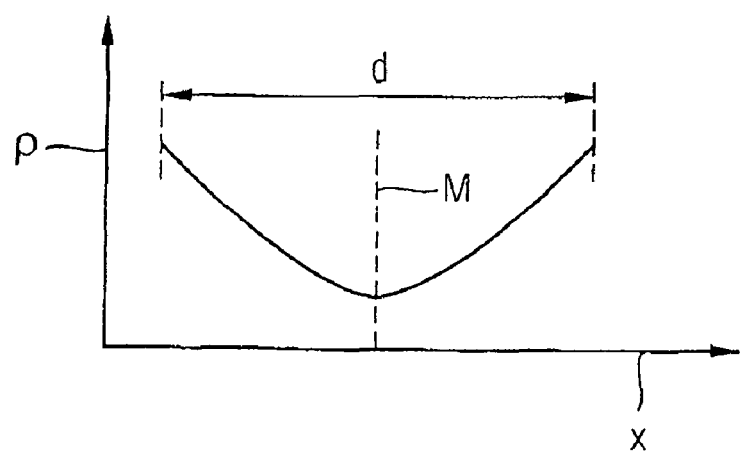
FIG. 3 shows an illustration in the form of a graph of a profile of the resistivity according to one embodiment of the present invention.
Figure 4:
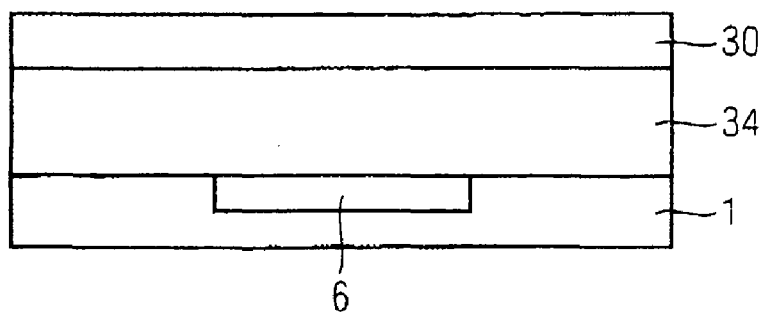
FIGS. 4 to 8 show schematic cross sections in order to explain one embodiment of the production method according to the invention.
Figure 5:
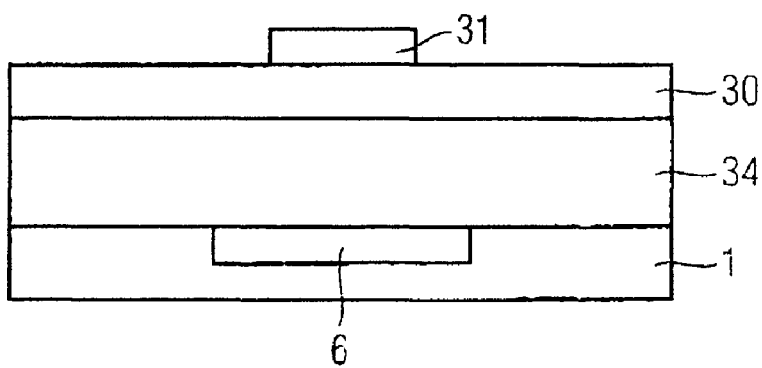

In the preferred embodiment of the present invention, the resistivity $\rho$ in an edge area 16 is therefore higher than in a core area 15. FIG. 3 shows a graph relating to this of the resistivity $\rho$ plotted on a horizontal axis X, which is located in a cross-sectional area 100 parallel to the contact surfaces 5, 6. M denotes the centre of the core area 15 and d denotes the width of the overall cell 14. The difference between the resistivity in an outer area to that in a core area may even be two orders of magnitude, thus corresponding to the difference between the resistivity $\rho$ between the amorphous phase and the glass phase. The graph of the resistivity $\rho$ is illustrated in FIG. 3 for the crystalline phase of the cell 14. When the cell 14 is in the low-resistance state, the increase in the resistivity $\rho$ in the edge areas results in only a small increase in the overall resistance of the cell 14. However, the increase in the edge area 16 leads to the cell 14 having a considerably higher total resistance in the high-resistance state than a cell with a low-resistance crystalline edge area. This therefore increases the difference between the high and the low total resistance. This advantageously increases the reading reliability, because of the better capability to distinguish between the two states.

A further advantage of the embodiment is that it is possible to reduce the heating current since amorphous edge areas, as explained above, have less influence on reading reliability. This means that a transistor which is switching the heating current is arranged with smaller dimensions. Since the size of these transistors is the major limiting factor for the integration density of these memory cell arrangements, it is highly desirable to reduce the dimensions of these transistors.

A further advantage of the reduced required heating power is that a memory module with the abovementioned cells 14 produces less heat while being written to and erased. The thermal load on adjacent components can thus be reduced. In addition, the battery life is extended—particularly in mobile applications.

The profile of the resistivity ρ as illustrated in FIG. 3 is only one example. An optimum profile can be calculated taking into account thermal transport balancing, the melting temperature to be achieved and the desired difference between the total resistances in the high-resistance state and low-resistance state. The concentration in the edge area of the cell 14 is controlled by increasing or decreasing the concentration of the impurities in the surrounding atmosphere. The diffusion rate and the diffusion transport of the impurities in the cell are controlled, and the desired optimum profile is thus set, by means of a temperature profile over a time period.

Figure 6:
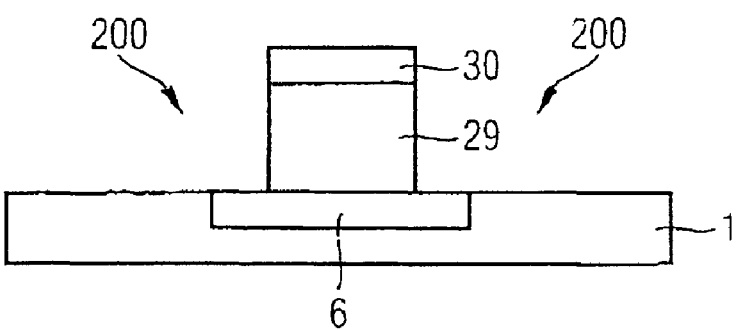
Figure 7:
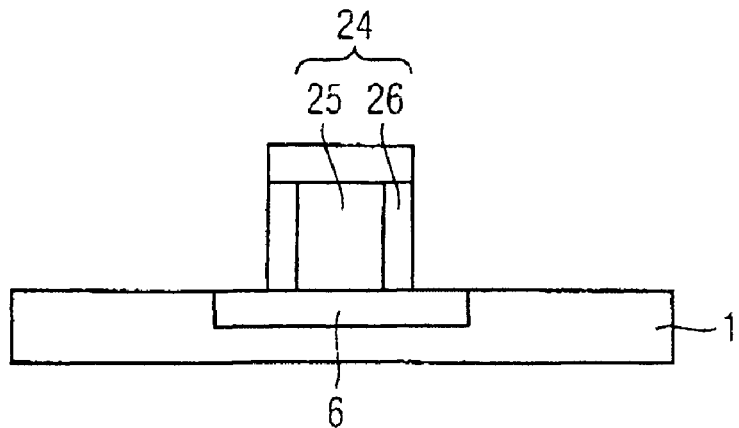

FIGS. 4 to 8 schematically illustrate one embodiment of the production method according to the invention. An active material 34 is applied to a mount substrate 1 with a contact area 6. This may be done, for example, using a sputtering process. Typical materials are chalcogens, as already mentioned above. A hard mask, composed of silicon oxide for example, is deposited on the active material 34 (see FIG. 4). The hard mask 30 and the active material 34 are structured by application of a resist layer 31, a lithographic step and, possibly, suitable spacer and back-etching techniques in order to achieve sub-lithographic dimensions, as well as etching, thus resulting in a cell 24 being formed above the contact area 6. As can be seen in FIG. 6, the residue of the hard mask 30 still covers an upper area of the cell 24 after the structuring process.

The cell 24 is subjected to an atmosphere with nitrogen and/or oxygen at a raised temperature. The oxygen and/or nitrogen molecules diffuse into the cell 24. The concentration of these impurities decreases from the edge area 26 towards the core area 25. This takes place on a self-organizing basis owing to the limited diffusion rate of the impurities in the active material 34. The oxygen impurities, and in particular the nitrogen impurities, increase the resistivity of the active material 34 that contains chalcogens. Since the concentration of the impurities in the edge area is, as described above, higher than in the core area, the resistivity ρ is also higher in the edge area 26 than in the core area 25 in a corresponding manner, as desired.

The remaining residue of the hard mask 30 protects the upper surface against impurities diffusing into it. In a further embodiment, there is no need for the cover layer 30 if it is also intended to increase the resistivity in the upper top surface of the cell 24. This may be necessary when the melting temperature of the active material 34 in the vicinity of the contact area 6 is not reached owing to the large amount of heat dissipation, so that no amorphous phase can be generated in this area.

Figure 8:
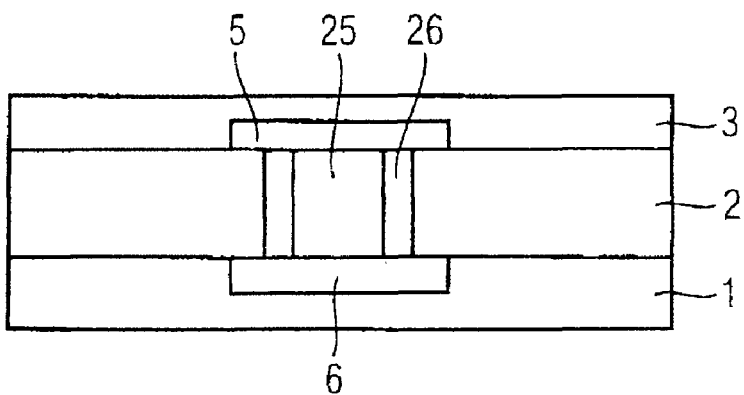

If still necessary, the hard mask 30 is removed in subsequent steps, the cell 24 is embedded in a filling compound 2 and, finally, an upper contact-making surface 5 and a cover layer 3 are applied to the cell 24 (see FIG. 8).

A further embodiment (not illustrated) of the present invention provides for a layer containing chalcogenides and having a low concentration of impurities to be applied first of all, and for this layer to be structured in order to form the core area 16 of a memory cell 14. A series of, or at least one, further layer which contains chalcogenides and has a rising concentration of impurities is then applied. Each individual layer can be structured as appropriate and the excess material on the top surface can optionally be polished off, in order in this way to attach more highly doped edge areas 16 laterally adjacent to the core area 16. The impurities can be supplied in a surrounding atmosphere even during the deposition or physical deposition of the layer containing chalcogenides, in order to obtain correspondingly doped layers.

Figure 9:
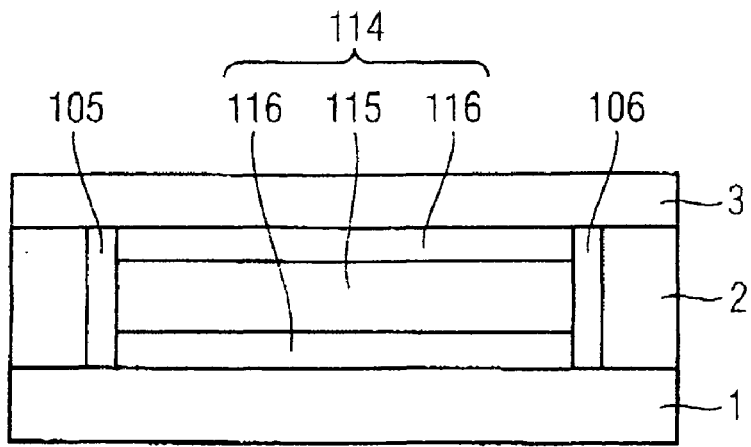
FIG. 9 shows a schematic cross-sectional view of a third embodiment of the present invention.

A further embodiment provides for the memory cell 114 not to be arranged vertically with respect to the mount substrate 1, but parallel to it, as is shown in FIG. 9. For this purpose, a layer sequence is applied to layers which contain chalcogenide, starting and ending with a high concentration of impurities, and with the concentration in the central layers which form the core area 116 being less. As in the first embodiment, the layer sequence is finally structured in order to form the cell 114. In contrast to the previous embodiments, contact areas 105, 106 can be arranged vertically in a corresponding manner. One advantage of this method is that it allows the concentration profile of the impurities in the cell to be monitored easily and reliably, by appropriately increasing or decreasing the concentration of the surrounding atmosphere during the deposition of the layers.

Although the present invention has been described with reference to one preferred embodiment, it is not restricted to this.

In particular, the dimensions of the contact areas 5 and 6 are illustrated only as examples. Their lateral dimensions may also be less than the cell 14, 24.

Other methods can likewise be used for introduction of impurities into the active material 34. These include, for example, plasma-assisted implantation or other implantation techniques from a direction 200 which may either be at right angles to the edge area or may be at an angle to the edge area.

The choice of materials for the contact areas includes tungsten, titanium nitride, titanium, SiN, TaSiN, TiAln, TaAln and/or tantalum nitride. The already known production methods for making contact with silicon and doped silicon can thus advantageously be used to make contact with the chalcogenides.

Although the present invention has been described with reference to a memory apparatus, the cell 14, 24 can also be used as a permanently variable resistance.

The invention claimed is:

1. A method for producing an integrated circuit including a cell in a memory apparatus, the method comprising:
    applying and structuring a phase change material to a mount substrate to form a preform of the cell; and
    introducing impurities into the perform such that the concentration of impurities in an edge area is higher than in a core area of the preform to form the cell which has reduced specific electrical conductivity in the edge area and such that sidewalls of the core area are perpendicular to the mount substrate,
    wherein the impurities are introduced by diffusion from an atmosphere containing the impurities.

2. The method of claim 1, wherein the concentration of the impurities decreases continuously from the edge area to the core area.

3. The method of claim 1, wherein the impurities include oxygen, nitrogen and/or silicon.

4. The method of claim 1, wherein the concentration of impurities in the atmosphere during the application of the phase change material is reduced from a first maximum value to a minimum value and is then increased again to a second maximum value, so that the core area has a lower concentration than layers of the active material which are applied first and last.

5. The method of claim 1, wherein the impurities comprise silicon.

6. A method for fabricating an integrated circuit, the method comprising:
    providing a substrate including a first contact;

depositing an active material over the first contact;

etching the active material to provide a cell consisting of active material directly physically contacting the first contact;

introducing impurities into the cell to provide an edge region of the cell having a higher concentration of impurities than a core region of the cell and such that sidewalls of the core region are perpendicular to the first contact; and fabricating a second contact directly physically contacting the active material, wherein introducing the impurities comprises introducing the impurities by diffusion from an atmosphere containing the impurities.

7. The method of claim 6, wherein depositing the active material comprises depositing a phase change material.

8. The method of claim 6, wherein introducing the impurities comprises introducing at least one of oxygen, nitrogen, and silicon.

9. The method of claim 6, wherein the impurities comprise silicon.

10. A method for fabricating an integrated circuit, the method comprising:

providing a substrate including a first contact comprising a surface;

depositing a phase change material over the surface of the first contact;

etching the phase change material to provide a cell consisting of phase change material directly contacting the surface of the first contact;

introducing impurities by diffusion from an atmosphere containing the impurities into sidewalls of the cell to provide an edge region of the cell having a higher concentration of impurities than a core region of the cell and such that sidewalls of the core region are perpendicular to the surface of the first contact;

laterally surrounding the cell with a filling compound, the filling compound directly contacting the surface of the first contact; and fabricating a second contact directly contacting the phase change material and the filling compound.

11. The method of claim 10, wherein the impurities comprise silicon.

* * * * *